(12) United States Patent
Richter

(10) Patent No.: US 8,337,173 B2
(45) Date of Patent: Dec. 25, 2012

(54) ELECTRIC OSCILLATING DRIVE

(76) Inventor: Siegfried Richter, Sauldorf-Rast (DE)

( * ) Notice: Subject to any disclaimer, the term of this patent is extended or adjusted under 35 U.S.C. 154(b) by 713 days.

(21) Appl. No.: 12/480,865

(22) Filed: Jun. 9, 2009

(65) Prior Publication Data

US 2009/0304534 A1    Dec. 10, 2009

(30) Foreign Application Priority Data

Jun. 10, 2008 (DE) .................... 20 2008 007 730 U

(51) Int. Cl.
*H02K 7/065* (2006.01)
*H02K 33/00* (2006.01)
*B06B 1/06* (2006.01)
*H02N 2/00* (2006.01)
*F04B 17/03* (2006.01)
*F04B 19/00* (2006.01)
*F04B 37/00* (2006.01)

(52) U.S. Cl. ......... 417/413.1; 417/488; 310/20; 310/37; 310/328

(58) Field of Classification Search .................. 417/363, 417/412, 413.1, 413.2, 481, 487, 488; 310/15–24, 310/36, 37, 311, 323.01, 323.02, 328
See application file for complete search history.

(56) References Cited

U.S. PATENT DOCUMENTS

| | | | |
|---|---|---|---|
| 2,605,042 A * | 7/1952 | Reutter | 417/338 |
| 4,565,497 A * | 1/1986 | Miller et al. | 417/63 |
| 5,730,587 A * | 3/1998 | Snyder et al. | 417/413.1 |
| 6,249,198 B1 * | 6/2001 | Clark et al. | 335/229 |
| 6,705,845 B2 * | 3/2004 | Krieger et al. | 417/488 |
| 6,935,539 B2 * | 8/2005 | Krieger et al. | 222/221 |

FOREIGN PATENT DOCUMENTS

| | | |
|---|---|---|
| DE | 102006043219 | 2/2008 |
| DE | 102006043219 B3 | 2/2008 |
| DE | 102006050062 | 4/2008 |
| JP | 2004222414 | 8/2004 |

* cited by examiner

*Primary Examiner* — Devon Kramer
*Assistant Examiner* — Bryan Lettman
(74) *Attorney, Agent, or Firm* — McGlew and Tuttle, P.C.

(57) ABSTRACT

An electric oscillating drive with at least one oscillating system (1), which is driven in an oscillating manner by an actuator, especially a piezo actuator (2) or an oscillating armature magnet generating periodic force pulses with a small motion amplitude with adapted natural frequency in a preset plane (31). At least one oscillating arm (30') performing oscillating motions has a resonant mass (55') and with a balance arm (60'), which is in mechanical driving connection with a working member (7) of a working device, especially of a pump (3), which working member is to be driven in an oscillating manner. The oscillating arm (30, 30') is fastened to two levers of unequal length, namely a control arm (32') and a driving lever (33'). At least one of these two levers, especially the control arm (32'), is flexurally elastic at least in some sections.

30 Claims, 10 Drawing Sheets

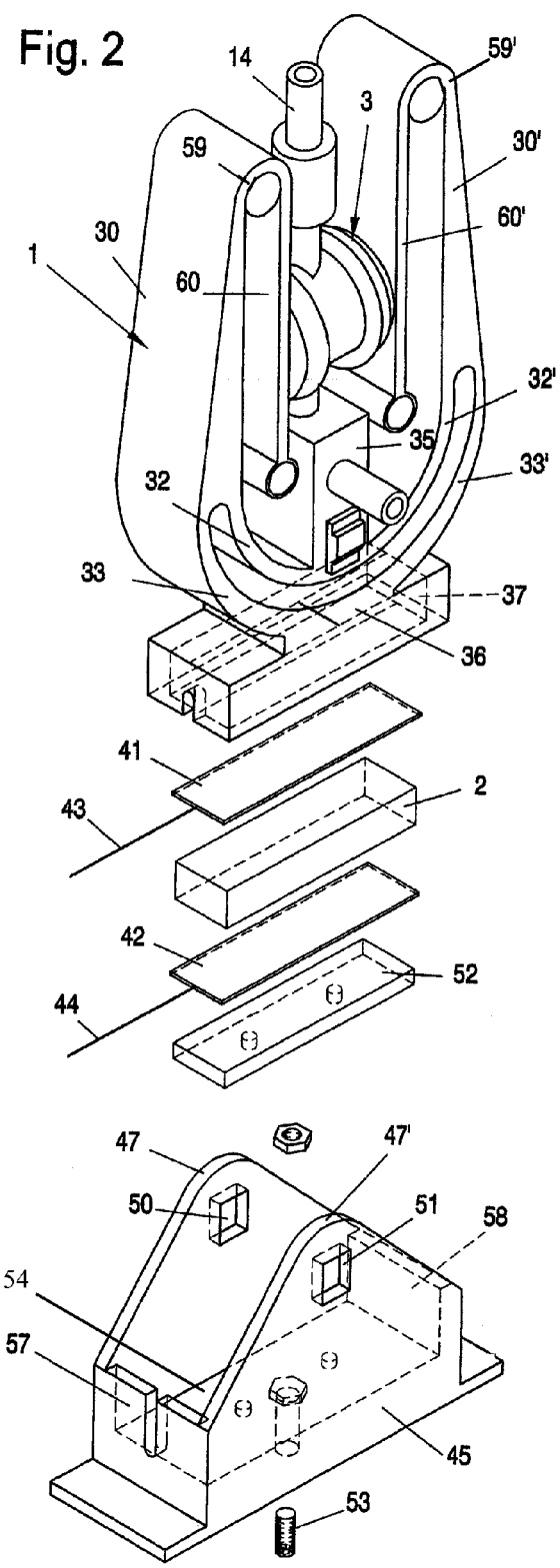

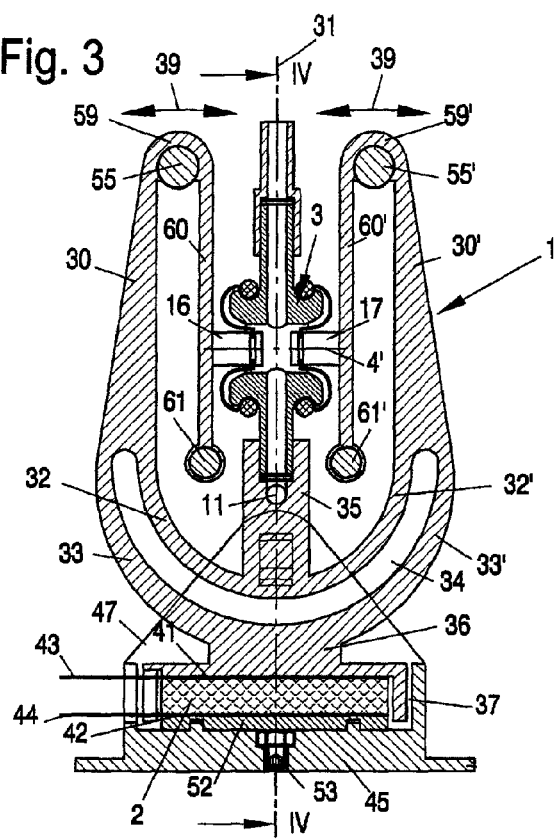
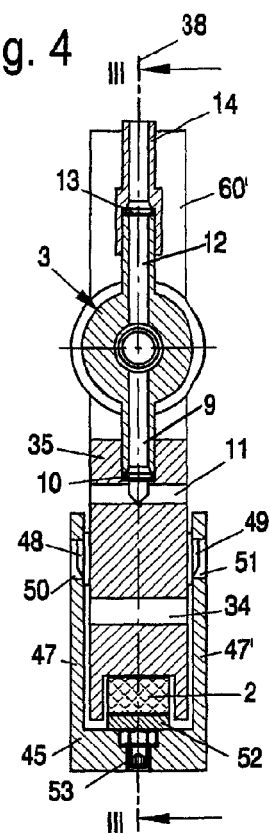
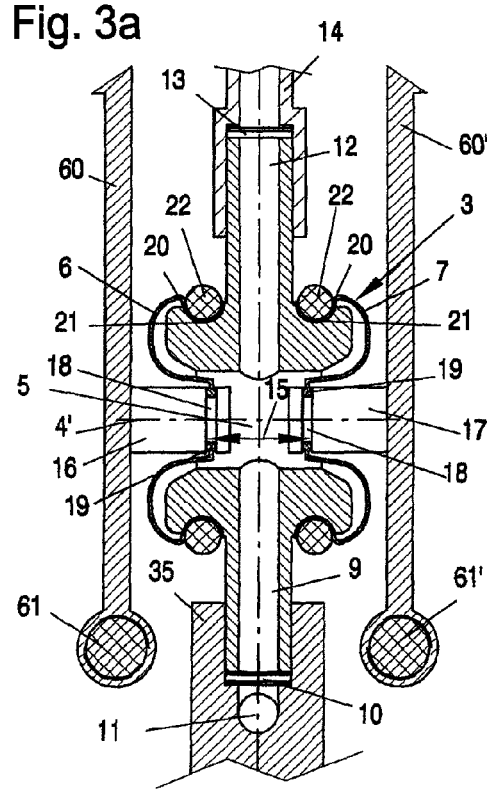

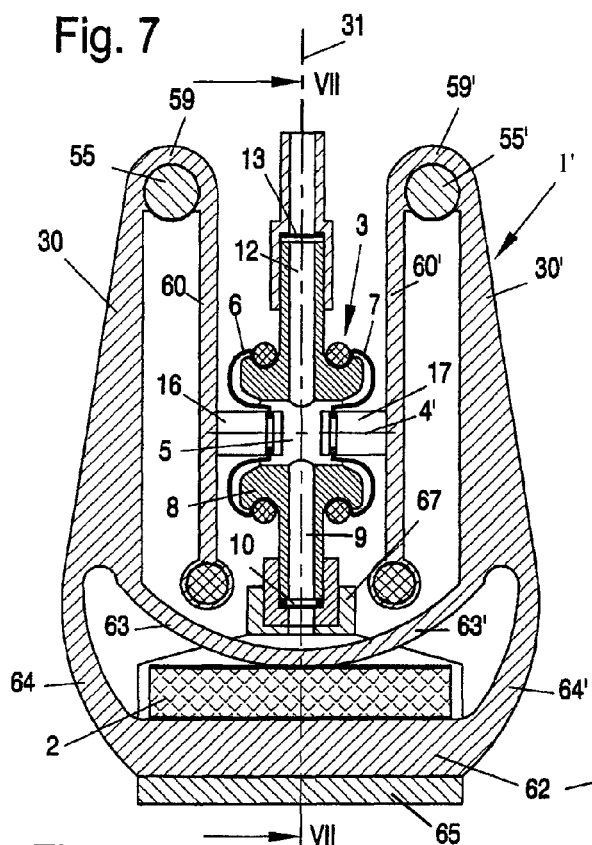
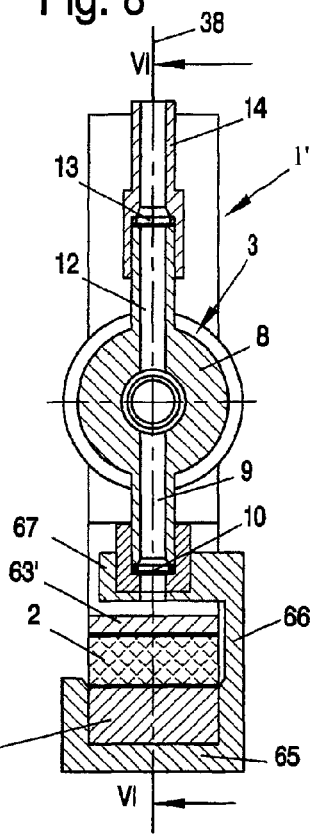
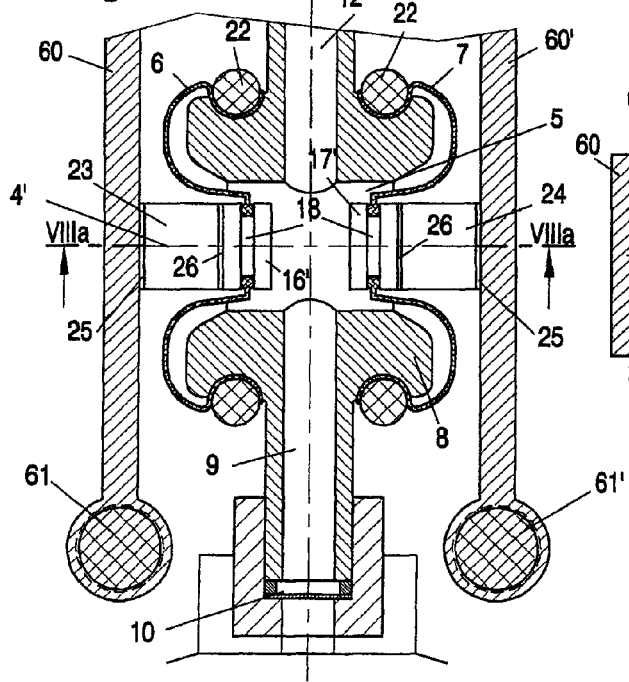
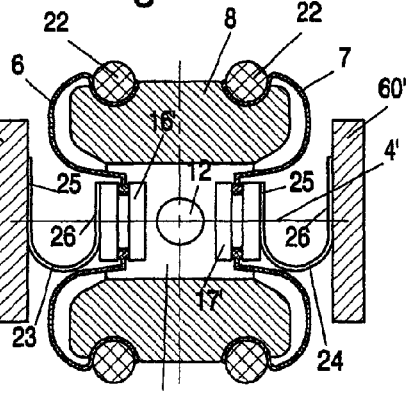
Fig. 7
Fig. 8
Fig. 5
Fig. 5a

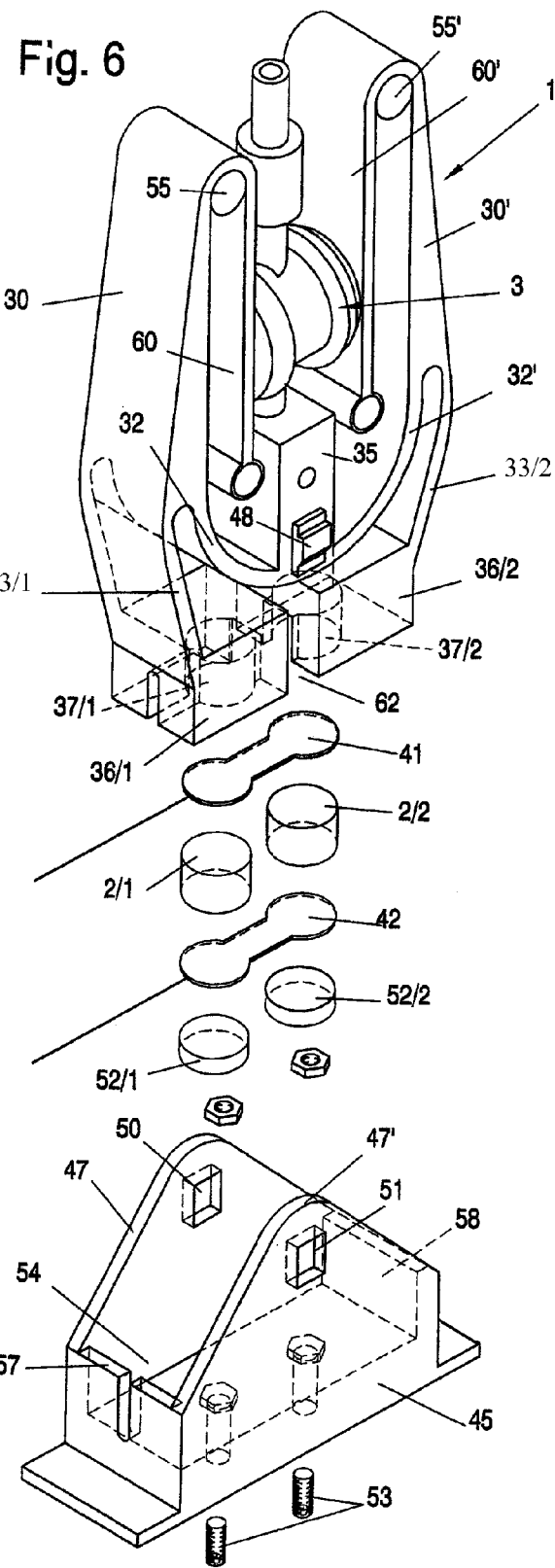

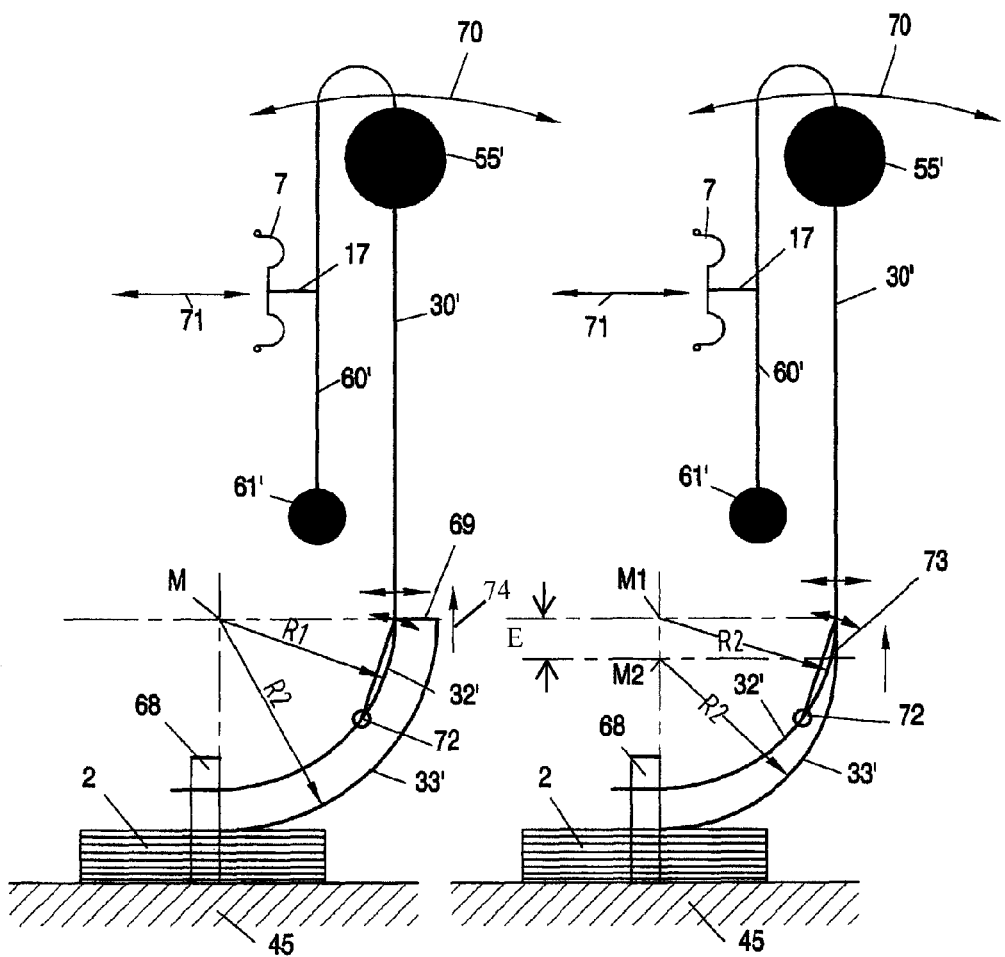

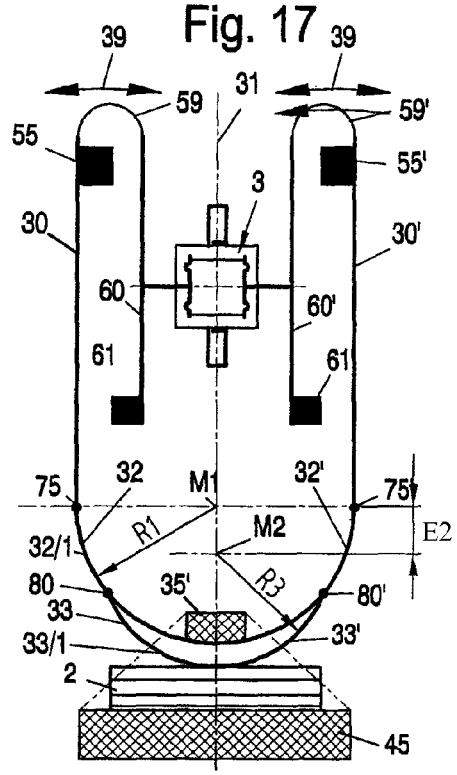
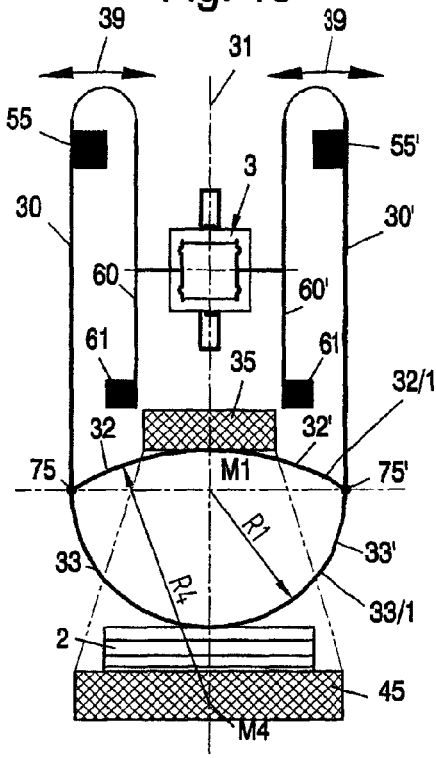
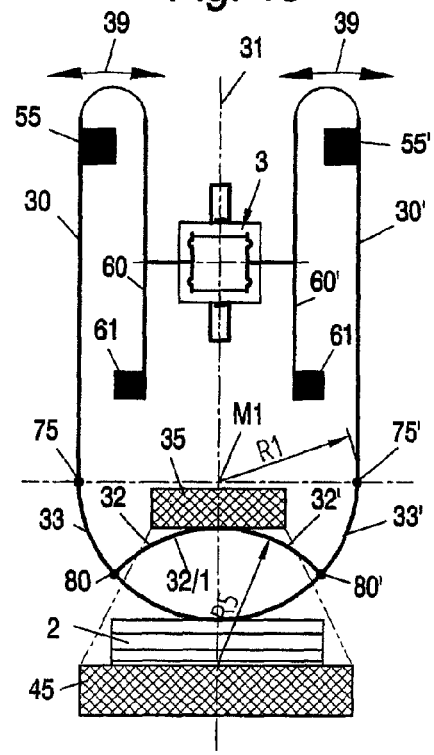
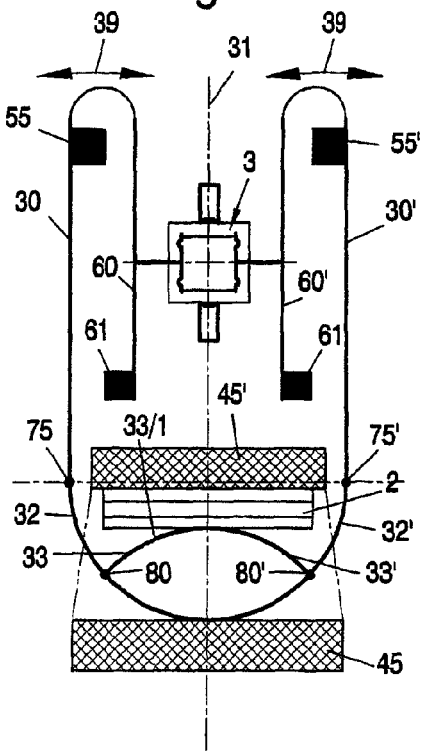

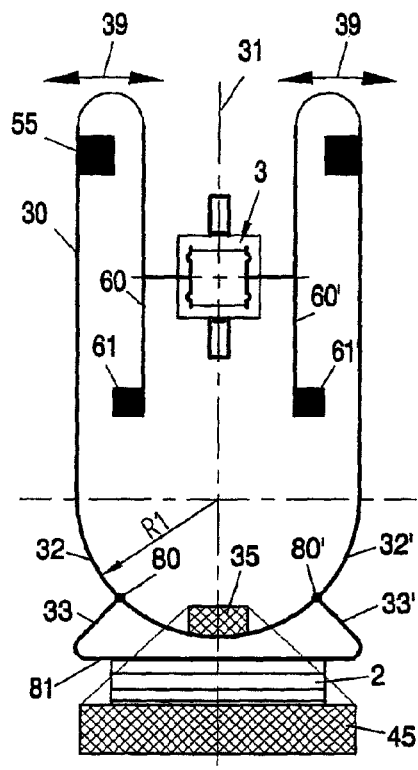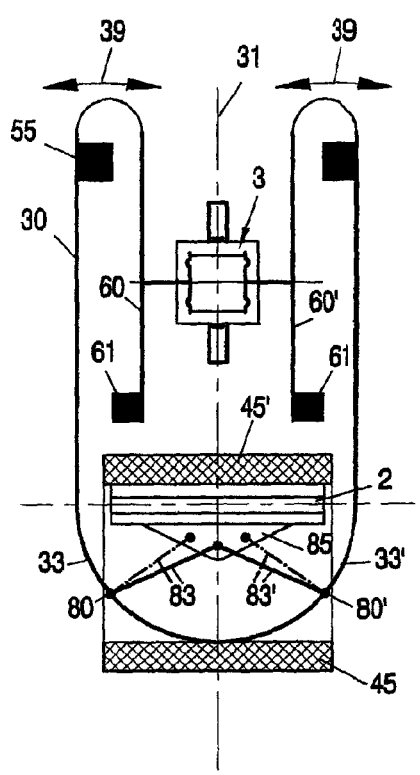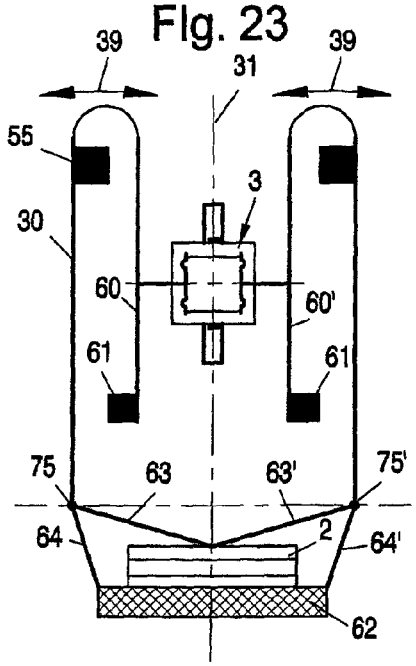

ELECTRIC OSCILLATING DRIVE

CROSS REFERENCE TO RELATED APPLICATIONS

This application claims the benefit of priority under 35 U.S.C. §119 of German Patent Application DE 20 2008 007 730.3 filed Jun. 10, 2008, the entire contents of which are incorporated herein by reference.

FIELD OF THE INVENTION

The present invention pertains to an electric oscillating drive with at least one actuator, especially a piezo actuator or an oscillating armature magnet, which generates periodic force pulses with a small motion amplitude, with an oscillating system driven in an oscillating manner with an adapted natural frequency in a preset plane, which said system has at least one oscillating arm performing pendular oscillating motions with a resonant mass and with a balance arm, which is in mechanical drive connection with a working member of a working device, especially a pump, which said working member is to be driven in an oscillating manner via a coupling member of the balance arm.

BACKGROUND OF THE INVENTION

A piezoelectric pump drive, especially for air pumps, in which a diaphragm is driven as a working member by a resonant oscillating system in an oscillating manner, is known from DE 10 2006 043 219 B3. This resonant oscillating system has at least one resonant spring, which is designed as a leaf spring, forms the oscillating arm and carries the resonant mass on a long lever arm. This long oscillating arm carrying the resonant mass is driven by a piezo element via a short driving lever in an oscillating manner, i.e., it is set to oscillate. The driving lever fixed stationarily with one end to a frame and the resonant spring are connected to one another in one piece, i.e., they together form one component. The oscillating means can be fixed in a defined plane in a simple manner due to the use of a leaf spring as a resonant spring, and leverages and hence motion transmissions between the driving lever and the resonant spring by which high work outputs can be attained with high efficiencies, are obtained due to the use of different lever arms of the short driving lever, on the one hand, and of the longer oscillating arm, on the other hand.

The resonant spring or oscillating arm is provided in various embodiments of this prior-art piezo drive at the end provided with the resonant mass with a rearwardly bent end section, which extends in parallel to the resonant spring and to which a so-called balance mass is fastened. This balance mass, fastened to the end section of the resonant spring, which said end section acts as a balance arm, brings about an at least approximately parallel oscillation of the end section or of the balance arm in relation to its extension, i.e., relative to itself. Whether this parallel oscillation is indeed achieved also depends, among other things, on the degree of bending elasticity of the balance arm and of the resonant spring. Since both the resonant spring and balance arm consist of a leaf spring in this prior-art piezoelectric pump drive, high bending elasticity can be assumed for both. However, high bending elasticity may lead to an oscillating characteristic deviating from parallelism.

The section of the resonant spring carrying the resonant mass or the resonant mass itself is connected directly to the working member of the working device, i.e., to the pump diaphragm of the fluid pump, via suitable coupling elements in this prior-art embodiment. The resonant mass fastened to the end section of the balance arm, which said end section is connected to the connection arc, and the coupling member connected thereto [said resonant mass—Tr.Ed.] do not perform any pure parallel oscillation in relation to the plane in which the valance arm extends, but an arc-shaped motion, which may have a harmful effect on the working member, i.e., on the pump diaphragm. Another embodiment of this prior-art piezoelectric pump drive is provided with a resonant spring, which has three spring legs, which are connected to one another in one piece by arc sections extending over 180° and are consequently directed rearwards and extend in parallel to one another in an S-shaped pattern. The resonant mass is arranged in the vicinity of the first arc section at the middle spring leg. The balance mass is located at the free end of the third spring leg. The coupling element, which connects this spring leg to the pump diaphragm, is also located approximately in the longitudinal center of this third spring leg. It can be assumed in this embodiment that the third spring leg oscillates in parallel to itself or to the plane in which it extends and that its motions do not have a harmful effect on the pump diaphragm.

However, a three-legged resonant spring is disadvantageous because it requires more space than an only two-legged spring and because it can get out of step more easily, i.e., it is more prone to trouble. In addition, it is more difficult to tune a three-legged spring to the adequate natural frequency than a two-legged one.

The resonant spring and balance spring consist of leaf springs each with high spring elasticity in this prior-art drive device, which experience has shown to be able to lead rather to resonance deviations and hence to operating troubles when a resisting force develops.

SUMMARY OF THE INVENTION

The basic object of the present invention is to provide an electric oscillating drive of the type described in the introduction, which has a compact design, can be manufactured in a simple and cost-effective manner, operates trouble-free with high efficiency and has a long service life.

This object is accomplished according to the present invention in a simple embodiment by the oscillating arm being fastened to two levers of unequal length, namely, a control arm and a driving lever, wherein at least one of these two levers, especially the control arm, has a flexurally elastic design at least in some sections, and its end not connected to the oscillating arm is immovably connected to a frame part at a point located at a remote location from the oscillating arm and in which the actuator is located, and in which the actuator is mounted, and wherein the driving lever is in a motion-transmitting connection with the actuator such that the force pulses of the actuator are sent to the oscillating arm for said oscillating arm to generate its pendular oscillation in a direction that is at least approximately parallel to the direction in which this oscillating arm extends in the inoperative position.

An oscillating drive provided with these features can be embodied in a simple manner and at a low cost due to the fact that the components of the oscillating system, which carry the resonant mass and the balance mass, can be manufactured of a dimensionally stable plastic as an injection molding in one piece together with the control arm and the driving lever. The properties of dimensional stability and bending elasticity, which are necessary for optimal functioning, can be set by selecting the suitable plastic, e.g., Delrin or polyamide, and by suitable shaping. Only the resonant masses and the balance mass, which preferably consist of metal because of the heavier weight, are to be fastened to the oscillating arm or the balance arm as separate individual parts in a suitable manner, for example, by snap-in connections.

Additional spring elements, which bring about the restoring forces needed for the generation and maintenance of the oscillating motions, are also not necessary.

These spring-generated restoring forces are applied by the flexurally elastic levers, namely, the control arm and/or driving lever, when they are flexurally deformed by the oscillating motions of the oscillating arm in connection with their bending elasticity. The means necessary for receiving and mounting the actuator, which may comprise a piezo actuator or an oscillating armature magnet of a minimum size, in a secure position, may also be manufactured from a one-piece plastic part, which may be preferably designed as a base of a frame carrying the entire oscillating system in a stable position.

While only one working member of a working device, for example, the diaphragm of an air pump, can be driven with an oscillating system which has only one oscillating arm and only one balance arm, another embodiment of the present invention, which is based on the same principle of operation, offers the advantageous possibility of driving two working members in an oscillating manner. This embodiment makes provisions for providing two oscillating arms in a symmetrical arrangement in relation to a plane of symmetry, which said two oscillating arms are fastened each to a pair of two levers of unequal length, namely, a control arm and a driving lever, wherein each one of these two levers, especially the control arm, has a flexurally elastic design at least in some sections and its end not connected to the oscillating arm is connected immovably to a frame part at a point located remotely from the oscillating arm, in which [said frame part] the actuator is mounted, and wherein the driving lever is in a motion-transmitting connection with the actuator such that the force pulses of the actuator are sent to the oscillating arms to generate the pendular oscillations thereof in a direction that extends at least approximately in parallel to the direction in which they extend in the inoperative position.

It is especially advantageous here that the two elements of the oscillating systems, namely, the two balance arms, which are each connected to a working member, can be designed and driven such that they oscillate synchronously. It is possible in a simple manner, i.e., without taking special measures, to synchronously drive two working members of a working device or two working devices at the same time.

The circumstance that the essential components of this double oscillating system can also be manufactured in one piece as a single plastic part with the required functional properties by corresponding molding and selection of the plastic shall be emphasized as an important advantage of this embodiment as well. This means that double work output can be obtained with nonessential extra cost with two working members driven simultaneously by the same actuator.

Any disadvantageous effects of the force of gravity on the oscillating system can be avoided by an embodiment of the present invention in which the plane of symmetry extends vertically. It makes no difference whether the oscillating system is standing upright or is suspended upside down or whether it is arranged such that the oscillating arms perform horizontal oscillating motions in the horizontal position.

An oscillating system that can be well controlled concerning both force transmission and constancy of oscillation is obtained by the embodiment with balance arms formed of a dimensionally stable, at best weakly flexurally elastic plastic. The opposite synchronous oscillating motions of the balance arms lead here to the functionally important advantage that a fluid pump can be used or operated with two pumping members, especially diaphragms, which are associated with the same pump chamber. The use of pump diaphragms as working members of a fluid pump, especially of an air pump, presents itself in the known manner because diaphragms offer hardly any appreciable resistance to the driving forces.

The motion in opposite directions of the synchronously oscillating oscillating arms and balance arms can be embodied in a simple manner. At least extensively coaxial motions of the coupling members establishing the connection between the balance arms and the working members can be achieved.

It is possible in a simple manner to transmit the oscillating driving motions synchronously to the two oscillating arms such that these perform synchronous, pendular oscillating motions without additional means being necessary for achieving the desired direction of motion. The oscillating motions thus generated are the same as those of a pendulum rod or rod pendulum.

Different embodiments are described, which can each be advantageously embodied in itself or combined with one another in order to obtain optimal solutions corresponding to the particular given requirements. The embodiment in which the two driving levers are each in functional connection separately with an actuator each is especially advantageous when the driving power of an individual piezo actuator is not sufficient to reach the required work output of the driven working members.

The embodiment with an elastic driving connection between the balance arm(s) and the working member, opens up the possibility of pumping not only air but also liquids with the fluid pump used, shall be pointed out in this connection.

The present invention will be explained in more detail below on the basis of the drawing figures listed below. The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 2 is an isometric exploded view of the electric oscillating drive according to FIG. 1;

FIG. 3 is a sectional view of the oscillating drive according to FIGS. 1 and 2 along section line III-III from FIG. 4;

FIG. 3a is the fluid pump according to FIG. 3 in an enlarged sectional view;

FIG. 4 is a section IV-IV from FIG. 3;

FIG. 5 is the fluid pump according to FIG. 3 but with elastic coupling elements in an enlarged sectional view;

FIG. 5a is a section VIIIa-VIIIa from FIG. 5;

FIG. 6 is an isometric exploded view of an embodiment of the oscillating drives equipped with two actuators;

FIG. 7 is another embodiment of the oscillating drive in a sectional view according to section line VII-VII from FIG. 8;

FIG. 8 is a section VIII-VIII from FIG. 7;

FIG. 11 is a schematic view of another different embodiment of an oscillating drive;

FIG. 12 is a schematic view of another different embodiment of an oscillating drive;

FIG. 17 is a schematic view of another different embodiment of an oscillating drive;

FIG. 18 is a schematic view of another different embodiment of an oscillating drive;

FIG. 19 is a schematic view of another different embodiment of an oscillating drive;

FIG. 20 is a schematic view of another different embodiment of an oscillating drive;

FIG. 21 is a schematic view of another different embodiment of an oscillating drive;

FIG. 22 is a schematic view of another different embodiment of an oscillating drive; and FIG. 23 is a schematic view of still another different embodiment of an oscillating drive.

DESCRIPTION OF THE PREFERRED EMBODIMENTS

Figure 1:
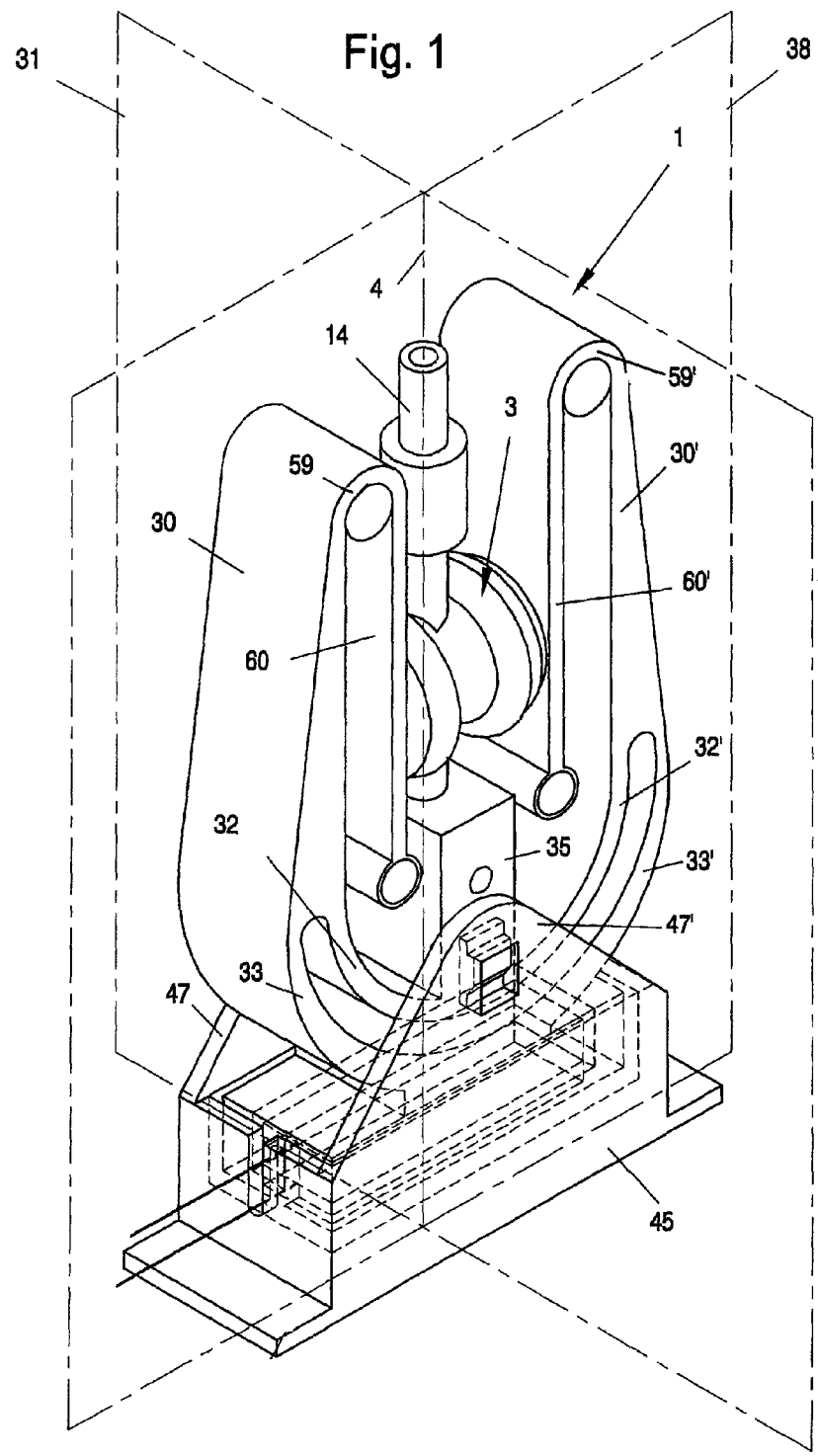
FIG. 1 is an isometric view of an electric oscillating drive for a fluid pump.

Referring to the drawings in particular, FIGS. 1 through 4 show a functional exemplary embodiment of an electric oscillating drive, in which an oscillating system 1 of a piezo actuator 2 (FIG. 2) is provided for actuating a fluid pump 3. The fluid pump 3 is a diaphragm pump, which has as the working members or pumping members two pump diaphragms 6 and 7, which are arranged symmetrically to a vertical central axis 4 (FIG. 1) and coaxially to one another with a common horizontal axis 4' and are associated with a common pump chamber 5 (FIG. 3 and FIG. 3a). These pump diaphragms 6 and 7 are arranged in a self-holding manner on the two opposite sides of a pump body 8. The pump chamber 5, which is in connection with a suction hole 11 via a suction channel 9 and a suction valve 10, is located in this pump body 8. The pump chamber 5 is connected on the delivery side to a connection sleeve 14 via a discharge channel 12 and a discharge valve 13. Any desirable device to be operated with compressed air can be connected to this connection sleeve 14 via a flexible tube connection.

To make the pump chamber 5 periodically smaller and larger, it is necessary to move the two pump diaphragms 6 and 7 synchronously with one another and in opposite directions and coaxially to one another. These motions are indicated by double arrow 15 (FIG. 3a). The two pump diaphragms 6 and 7 are connected for this purpose in a positive-locking manner to central coupling elements 16 and 17 each, which perform these motions and which are each part of the oscillating system 1. In the exemplary embodiment according to FIGS. 3 and 3a, these two coupling elements 16 and 17 comprise cylindrical bolts each, which have snap ring grooves 18 each on their end sections facing each other, and reinforced edge sections 19 of a central, round opening, which each pump diaphragm 6, 7 has, are inserted in a positive-locking manner and under radial stress into said snap ring grooves 18.

The outer end sections 20 of the two pump diaphragms 6 and 7, which said edge sections have an approximately semicircular profile, are located in correspondingly semicircularly profiled snap ring grooves 21 of the pump body 8 and are each secured by lock washers 22.

The two coupling members 16 and 17 may be designed as rigid, massive bolts if the fluid pump 3 is used to pump air or other compressible gases only.

However, if the fluid pump 3 is used to pump non-compressible liquids, it is recommendable to use coupling members between the diaphragms 6, 7 and the oscillating driving members of the oscillating system 1, which are elastic in the direction of push. An exemplary embodiment of such elastic coupling members is shown in FIGS. 5 and 5a. They are respective leaf springs 23 and 24 bent in the shape of a U, one leg 25 each of which is in connection with the oscillating system 1, while the other leg 26 is connected to a respective coupling member 16' and 17', which has the aforementioned snap ring groove 18, in which the perforated edge 19 of the respective pump diaphragm 6 and 7 is received in a positive-locking manner.

Other forms of elastic coupling members, e.g., elastically mounted bolts or the like, are, of course, conceivable as well.

As can be determined from FIGS. 1 through 4, the oscillating system 1 comprises, in a preferred embodiment, two oscillating arms 30 and 30', which are arranged symmetrically to a vertical plane of symmetry 31 located in the central axis 4 of the fluid pump 3 and extend essentially in parallel to this. The lower ends of the oscillating arms 30 and 30' are connected each in one piece to two levers of unequal length, namely, a respective control arm 32 and 32' and a respective driving lever 33 and 33', which consist, just as the oscillating arms 30 and 30', of a dimensionally stable, but at least weakly flexurally elastic plastic.

Figure 13:
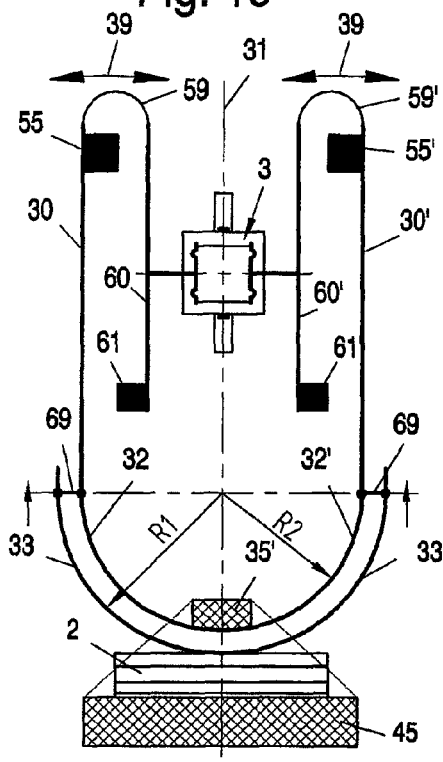
FIG. 13 is a schematic view of another different embodiment of an oscillating drive.
Figure 14:
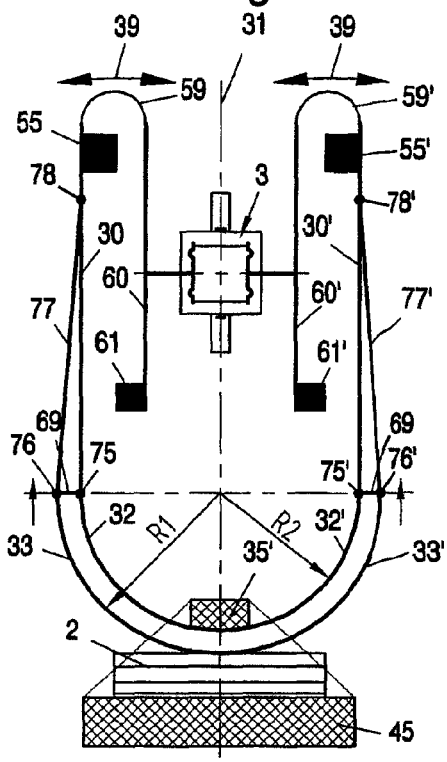
FIG. 14 is a schematic view of another different embodiment of an oscillating drive.

As is apparent from the graphic representations, especially from FIG. 3, the two control arms 32, 32' are connected to one another in one piece in the area of the plane of symmetry 31 and are shaped such that they together form a semicircle, whose ends are connected to the two oscillating arms 30 and 30', respectively. The two respective driving arms 33 and 33' also form together a semicircle, whose ends are connected to the two oscillating arms 30, 30', respectively. The unequal length of the control arms 32, 32', on the one hand, and of the driving arms 33, 33', on the other hand, arises in this geometry from the different radii R1 and R2, which are shown in FIGS. 11, 13 and 14.

As is apparent from FIGS. 1 through 3, there is a continuous groove 34, which separates the two semicircular levers from one another, between the control arms 32, 32', forming a semicircle each, on the one hand, and the driving arms 33, 33', on the other hand. The cross-sectional shapes of the control arms 32, 32' and of the driving levers 33, 33' are each rectangular, i.e., they are each of a strip-shaped design. It is guaranteed by correspondingly selecting the plastic used and by the cross-sectional shape or by the particular thickness, which the control arms 32, 32' and 33, 33' have, that both the control arms 32, 32' and the driving levers 33, 33' have a certain flexural elasticity, which makes possible a pendular oscillating motion of the two oscillating arms 30 and 30'. The oscillating motions of the oscillating arms shall be as similar to those of a rod type pendulum as possible.

While a support part 35 connected in one piece to the two control arms 32, 32' is arranged symmetrically to the plane of symmetry 31 within the semicircle formed by the two control arms 32, 32', the two driving levers 33 and 33' are provided, on the outside of the semicircle formed by them, with a downwardly directed foot part 36, which is designed as a cuboid hollow body. This foot part 36 has a cavity 37, in which the preferably multilayer piezo actuator 2, which is, e.g., cuboid, is accommodated. This piezo actuator 2 is provided on the top side and on the underside with contact plates 41 and 42 (FIG. 2) each, via which it can be connected to an a.c. power source by means of connection lines 43, 44. A frame part 45 is provided to make it possible to establish a rigid connection in the area of the plane of symmetry 31 between the control arms 32, 32', on the one hand, and the piezo actuator 2, on the other hand. This frame part 45 is provided with two parallel, upwardly directed side walls 47 and 47', which accommodate between them the foot part 36 of the oscillating system 1 or of the two driving levers 33 and 33' as well as the piezo actuator 2 accommodated in this cavity 37 with its two contact plates 41 and 42. A stable connection is created by the side walls 47 and 47' of this frame part 45 between the piezo actuator 2 and the two control arms 32, 32' by the support part 35 being provided on both sides with locking cams 48 and 49 (FIG. 4), which mesh with fitting recesses 50, 51 in a positive-locking manner, as this is shown, for example, in FIG. 4.

The ends of the two control arms 32, 32', which ends are not connected to a respective oscillating arm 30 and 30', are immovably connected in this manner to the frame part 45 at a point located remotely from the oscillating arm 30, 30'.

It is necessary for the satisfactory functioning of the oscillating system 1 that the two driving levers 33, 33' with their foot part 36 lie on the piezo actuator 2 with a certain spring tension, so that the driving pulses of said piezo actuator, which occur in the rhythm of the alternating voltage applied, are transmitted to the driving levers 33, 33' and via these to the oscillating arms 30 and 30', respectively, without clearance and hence without loss and these will always perform pendular oscillating motions. The driving pulses of the piezo actuator 2 are transmitted in a direction that extends in parallel to the direction in which the oscillating arms 30 and 30' extend in their inoperative positions. The desired pendular oscillating motions of the oscillating arms 30 and 30', which are each provided with respective resonant masses 55 and 55' at their top ends, are obtained due to the arrangement and mode of action of the two control arms 32 and 32'. These resonant masses 55 and 55' are selected to be such that the two oscillating arms 30, 30' have natural oscillations each, whose frequency equals the frequency of the alternating voltage applied to the piezo actuator 2.

This synchronism between the driving pulses of the piezo actuator 2 and the natural frequency of the oscillating arms 30, 30' is of significance for an efficient function. Another requirement is that the two oscillating arms 30, 30' oscillate synchronously with one another and that their oscillating motions take place in the same plane 38. It is also important for the operation of the above-described fluid pump 3 that the oscillating arms 30, 30' perform their synchronous oscillating motions in opposite directions, so that the working members, i.e., the two pump diaphragms 6 and 7, will also move each synchronously with one another and in opposite directions relative to one another in order to bring about the double pump output.

Another requirement for an effective, trouble-free function of the oscillating drive is that the two working members, i.e., the two pump diaphragms 6 and 7, be actuated by driving motions taking place coaxially with one another. This means that the coupling members 16 and 17 as well as 16' and 17' (FIGS. 8 and 8a) are each moved at least approximately coaxially to one another. This is achieved by the coupling members 16, 17 and leaf springs 23 and 24 being fastened to respective balance arms 60 and 60' each. These balance arms 60, 60' have approximately the same length as the oscillating arms 30, 31 and they extend each in parallel to the oscillating arms 30, 30'. They are arranged between the oscillating arms 30, 30' symmetrically to the plane of symmetry 31 in parallel thereto and are each connected via flexurally elastic connection arches 59 and 59, respectively, to the respective corresponding oscillating arm 30, 30'. At their lower ends, the balance arms 60 and 60' are provided with balance masses 61, 61' each, which are selected to be such that the balance arms 60 and 60' perform each oscillating motions in the rhythm of the oscillating arms 30, 30' in parallel to themselves, so that the pump diaphragms 6 and 7 connected to them via the coupling members 16, 17 and 23, 24, respectively, are not subject to any harmful tilting motions.

The pendular oscillating motions of the two oscillating arms 30 and 30' extend in the oscillation plane 38 (FIG. 1) that is at right angles to the plane of symmetry 31 in the direction of double arrows 39 and 39'. Various measures can be taken to ensure that the oscillating arms 30 and 30' as well as the balance arms 60 and 60' will inevitably oscillate in a preset plane, namely, plane 38 and thus perform controlled working motions. Both the oscillating arms 30, 30' and the balance arms 60, 60' and the control arms 32, 32' directly connected to the oscillating arms 30 and 30' as well as the driving levers 33 and 33' are each provided with rectangular cross-sectional shapes in the preferred exemplary embodiments, i.e., they are at least approximately of a strip-shaped or leaf spring-like design. Another obvious possibility is to use two or more rods each, which are arranged in parallel next to another and are connected to one another at least in some sections, and which are bent such that they will have approximately the same shape in the side view as the exemplary embodiments.

The oscillating motions in opposite directions of the two oscillating arms 30 and 30' are achieved such that the connections between the oscillating arms 30, 30' and the control arms 32, 32' as well as the driving levers 33 and 33' are arranged each in a mirror-inverted manner or symmetrically to the plane of symmetry 31. In other words, the connections between the control arms 32, 32' and the oscillating arms 30, 30' are located, for example, within the connections that connect the driving lever 33, 33' to the oscillating arms 30, 30'.

To make it possible to reliably achieve or set the elastic prestress necessary for a satisfactory, efficient function between the foot part 36 and the piezo actuator 2 despite the inevitable manufacturing tolerances, the piezo actuator 2 lies with its underside on an adjusting plate 52, which can be adjusted by means of an adjusting screw 53 in the vertical direction relative to the frame part 45 and hence also relative to the two control arms 32, 32'.

A cavity 54, which is also closed on the front side and is open on the top side and in which the foot part 36 with the piezo actuator 2 is accommodated in a fixed position, is formed between the side walls 47 and 47' by front walls 57, 58 extending at right angles.

The embodiment shown in an exploded view in FIG. 6 differs from that according to FIGS. 1 through 4 only in that the foot part is interrupted and hence divided in the middle by a slot 62. The separate foot parts 36/1 and 36/2 formed as a result are connected, each in itself, to the two oscillating arms 30 and 30' via driving levers 33/1 and 33/2 that are not connected to one another. Separate, for example, cylindrical piezo actuators 2/1 and 2/2 are accommodated in these two foot parts 36/1 and 36/2 in corresponding cylindrical cavities 37/1 and 37/2. These piezo actuators 2/1, 2/2 can, however, be operated by common contact plates 41 and 42 with the same power source. The mode of operation is also the same as in the embodiments according to FIGS. 1 through 4. Two adjusting plates 52/1 and 52/2 as well as two adjusting screws 53 are provided as well.

FIGS. 7 and 8 show another embodiment with an oscillating system 1', in which the oscillating arms 30 and 30', the balance arms 60 and 60' as well as the fluid pump 3 are present in the same form and arrangement as in the exemplary embodiments according to FIGS. 1 through 5. However, the piezo actuator 2 is arranged in this embodiment according to FIGS. 7 and 8 between two flexurally elastic control arms 63 and 63', and the foot part 62 is connected in one piece to one of the oscillating arms 30 and 30' each via flexurally elastic control arms 64 and 64', respectively. The two driving levers 63 and 63' are located in this embodiment between the two control arms 64 and 64', which are in turn made integrally in one piece laterally with the foot part 62 and likewise have flat, strip-like cross sections. The piezo actuator 2 lies directly on the flat upper surface 65 of foot part 62, doing so under the elastic pressing pressure of the two likewise flat strip-like driving levers 63 and 63', which are connected to one another in the area of the plane of symmetry 31 and lie on the piezo actuator 2 on the top side. However, it is possible to arrange an adjusting plate between the foot part 62 wand the piezo actuator 2 in this arrangement as well.

Compared to the embodiment according to FIGS. 1 through 5, the driving levers 63, 63' and the control arms 64, 64' are transposed in this embodiment according to FIGS. 7 and 8 in terms of both their arrangement and their function. The mode of operation of the oscillating arms 30 and 30' and of the balance arms 60 and 60' connected to them is, however, the same.

Figure 9:
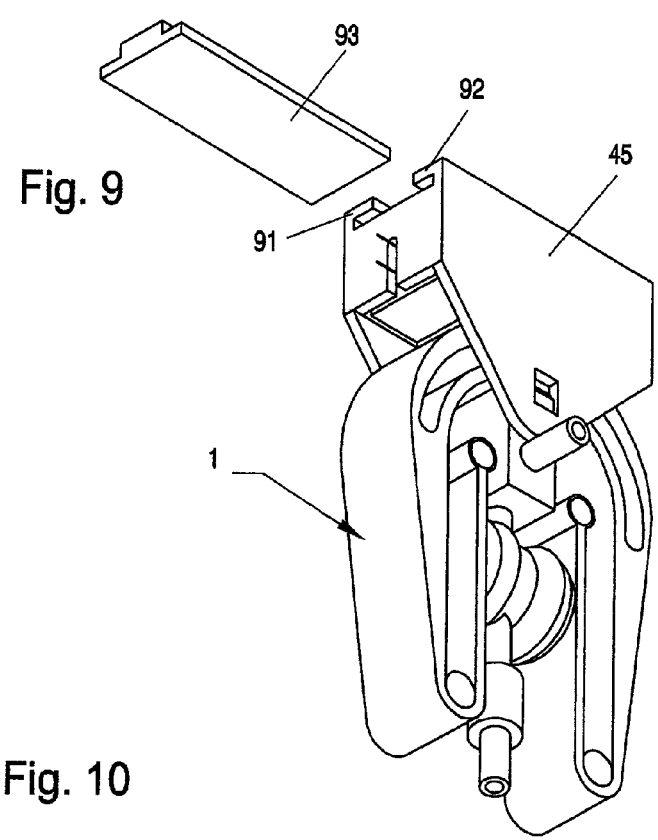
FIG. 9 is the oscillating drive according to FIGS. 1 through 4 in a suspended working position.
Figure 10:
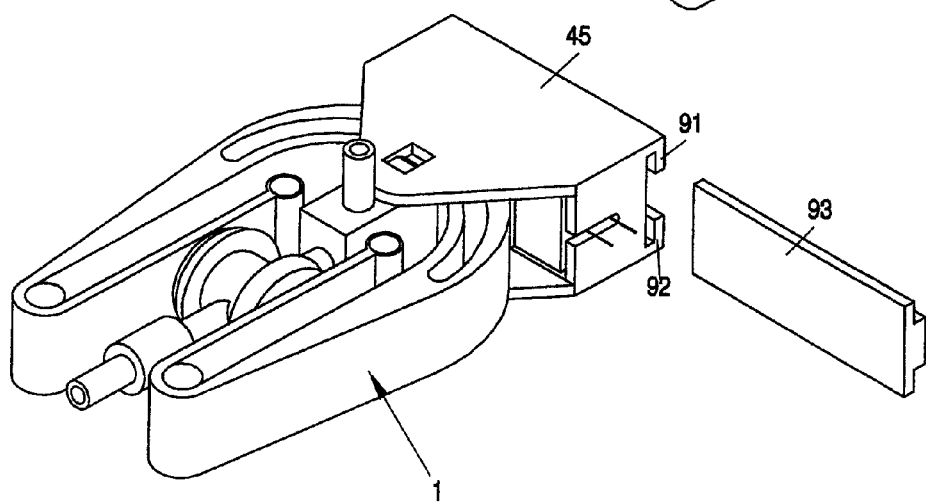
FIG. 10 is the oscillating drive according to FIGS. 1 through 4 in a horizontal working position.

To make it possible to connect the fluid pump 3 to the foot part 62 of the oscillating system 1' in a stable manner such that its position will be fixed, a base part 65 is provided, which accommodates the foot part 62. This base part 65 is provided on the side with a wall element 66, which has a carrier arm 67, which carryingly receives the fluid pump 3, on the concave side of the arc formed by the two driving levers 63, 63'. FIG. 9 shows the oscillating drive in a suspended working position and FIG. 10 shows the oscillating drive in a horizontal working position. The frame part 45 has portions 91, 92 for connecting to component 93.

It shall be indicated with this embodiment that there are more possibilities of embodying the principle of operation of the oscillating drive according to the present invention. Some of these possibilities shall be explained now on the basis of FIGS. 11 through 23.

While two oscillating arms with the corresponding control arms 32, 32' and driving levers 33, 33' as well as with balance arms 60, 60' are provided in the exemplary embodiment according to FIGS. 1 through 8 for actuating two working members in the form of pump diaphragms 6, 7, it is, of course, also possible to embody the same design principle and principle of operation with only one oscillating arm 30, as it is schematically shown in FIGS. 11 and 12.

Oscillating arm 30' is connected in FIG. 11, on the one hand, to a circular arc-shaped control arm 32' and to a driving arm 33' extending concentrically thereto. Control arm 32' has a radius R1 that is smaller than the radius R2 of the likewise circular arc-shaped driving lever 33'. Both levers 32' and 33' have the same center of curvature M. The lower end of the control arm 32' is connected to a frame part 68 stationarily in an immobile manner at a point located remotely from the oscillating arm 30' and hence at a defined distance from the piezo actuator 2. The piezo actuator 2 is also connected immovably to this frame part 68. The lower end of the driving lever 33' lies elastically and in a motion-transmitting manner on the top side of the piezo actuator 2, while its upper end is connected via a short connecting lever 69 to the lower end of the oscillating arm 30' and hence also to the upper end of the control arm 32'. The oscillating arm 30' articulated to the flexurally elastic control arm 32' is induced by the vertical driving motions of the piezo actuator 2 to perform pendular oscillating motions in the direction of double arrow 70. The balance arm 60', which also oscillates in parallel to itself, now actuates the pump diaphragms 7 in the direction of double arrow 71 via the connection member 17.

An oscillating motion of the upper end of the control arm 32', which takes place at least approximately about a hypothetical fulcrum point 72, is brought about by the flexural elasticity of the control arm 32'.

Approximately the same motions can also be achieved with the embodiment according to FIG. 12. The control arms 32' and driving lever 33' have the same radius of curvature each in this embodiment, but their centers M1 and M2 are offset in relation to one another by the measure E in the vertical direction in the plane of symmetry 31. Since the arches formed now by the two levers 32' and 33' have the same length, it is necessary to provided the upper end of driving lever 33' with an extension 73, via which it is connected to the upper end of the control arm 32' and also to the lower end of the oscillating arm 30'. Control arm 32' and driving lever 33' are thus again of unequal lengths. The driving motions taking place in the direction of arrow 74, i.e., in the direction in which the oscillating arm 30' extends, are transformed into oscillating motions of the oscillating arm 30', which extend at right angles thereto, in this case as well, so that the oscillating arm 30' performs the desired pendular oscillations in the direction of double arrow 70 and sets the diaphragm 7 into oscillating motions in the direction of double arrow 71 via balance arm 60'.

As is readily recognizable from FIGS. 11 and 12, the conditions for the advantageous leverages are satisfied here as well because, on the one hand, the control arms 32' and the driving levers 33' are of unequal length and, on the other hand, oscillating arm 30' is always longer than the effective lever arm on which the force pulses are transmitted from the piezo actuator 2 to the oscillating arm 30'.

This also applies to all the embodiments already described and yet to be described below.

It shall also be pointed out in this connection that all embodiments of this invention can be operated not only in the upright position, as it is shown in FIGS. 1 through 8 and in FIGS. 11 through 23, but in the suspended position as well, which is shown in FIG. 9, and in the lying, i.e., horizontal working position, as it is shown in FIG. 10. The force of gravity has no adverse or disturbing effect in these working positions on the mode of operation of the respective oscillating system 1 and 1'.

FIG. 13 shows a schematic view of the design and mode of operation of the oscillating system 1 shown in FIGS. 1 through 4 and 6.

The oscillating arms 30, 30', their balance arms 60, 60' as well as the control arms 32, 32' and the driving levers 33, 33' consist all of a dimensionally stable plastic in all embodiments. The balance arms 60, 60', control arms 32, 32' and driving levers 33, 33' associated with an oscillating arm 30, 30' each are connected to this [said oscillating arm] in one piece via flexurally elastic connection sections. The balance arms 60, 60' consists of a dimensionally stable, at best weakly flexurally elastic plastic. The pendular oscillating motions of the two oscillating arms 30, 30', which are located symmetrically opposite each other on both sides of the plane of symmetry 32, and the balance arms 60, 60' thereof extend synchronously and in opposite directions.

As was already mentioned, the connections between the oscillating arms 30, 30' and the control arms 32, 32' as well as the driving levers 33, 33' are arranged on both sides of the plane of symmetry 31 in mirror-inverted arrangements in relation to one another. In other words, if, for example, the connection between the driving lever 33 and the oscillating arm 30 is located outside the connection of the control arm 32 with the oscillating arm 30 in the embodiment according to FIGS. 1 through 3, the connection between the driving lever 33' and the oscillating arm 30' is also outside the connection of the control arm 32' with the oscillating arm 30' on the other side of the plane of symmetry 31. However, the connections between the control arms 64, 64' with the two oscillating arms 30, 30' are located outside the connections of the driving levers 63 and 63' with these control arms 30 and 30' in the embodiment according to FIG. 7. The mirror-inverted arrangement of these connections is guaranteed here as well, because this is the requirement for the oscillating arms 30 and 30' with their respective balance arms 60 and 60' to be driven in a synchronously oscillating motion in opposite directions.

The schematic view in FIG. 23 corresponds to the embodiment according to FIGS. 7 and 8. It shall be additionally mentioned in connection with this FIG. 23 that the two driving levers 63 and 63' shown there together can form a circular arc, as it is shown in FIG. 7. However, it is also possible, on the other hand, to design the two driving levers 63 and 63' each as straight, non-flexible flat rods, which are connected to one another in an articulated or flexurally elastic manner in the area in which they lie on the piezo actuator 2, i.e., in the area of the plane of symmetry 31. Their elastic contact with and on the piezo actuator 2 is brought about by the spring elasticity of the two control arms 64, 64'.

The schematic view in FIG. 14 corresponds fairly exactly to the embodiments according to FIGS. 1 through 3. The two control arms 32, 32', which extend in an arc-shaped manner and are connected to one another, as well as the driving levers 33 and 33' each form semicircles with the different radii R1 and R2 and with the same center of curvature M, which [said semicircles] are concentric to one another. There are lever arms 69 each, which are also present in the embodiment according to FIG. 11, between the respective connection points 75 and 75', by which the ends of the respective control arms 32 and 32' are connected to the respective oscillating arms 30, 30', and the respective connection points 76 and 76', at which the respective driving levers 33 and 33' are connected to respective rod-shaped extensions 77 and 77'. The respective extensions 77, 77' are rigidly connected in the upper end area at the respective connection sites 78 and 78' to the respective oscillating arms 30 and 30'.

While the semicircular arcs of the two driving levers 33 and 33' lie each centrally on the piezo actuator 2 in a motion-transmitting manner in the area of the plane of symmetry 31 and are actuated by this, the abutment 35' corresponding to the support part 35 is arranged on the concave inside of the circular arc formed by the two control arms 32, 32'. This abutment 35' is rigidly connected to the frame part 45. The elastic pressing pressure generated by the flexural elasticity of the control arms 32, 32' between the driving levers 33, 33' and the piezo actuator 2 is maintained or determined by the defined distance between this abutment 35' and the piezo actuator 2.

Figure 15:
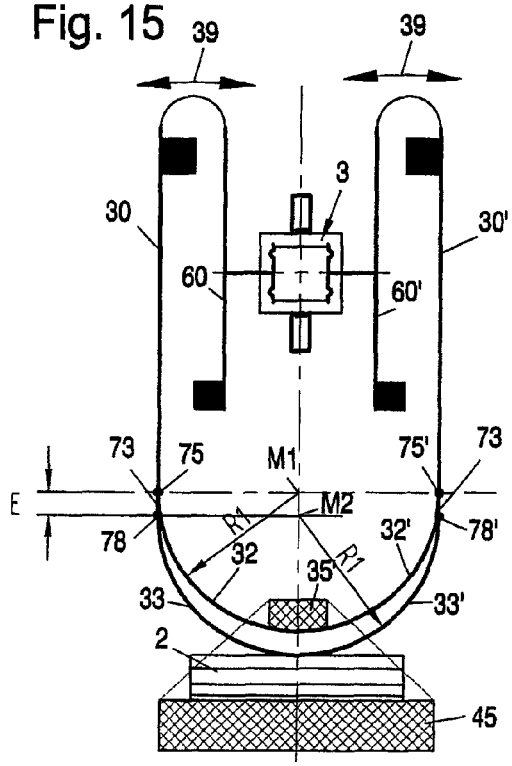
FIG. 15 is a schematic view of another different embodiment of an oscillating drive.

As in FIG. 11, the two semicircles formed by the control arms 32, 32', on the one hand, and by the driving levers 33, 33', on the other hand, are provided each with the same radii R1 in the embodiment according to FIG. 15 as well. However, the centers of curvature M1 and M2 are offset by the measure E from one another in the plane of symmetry 31. As in the embodiment according to FIG. 14, the ends of the control arms 32 and 32' are connected to the control arms 30 and 30' at the respective connection points 32 and 32'. Straight extending connection pieces 73, via which the connections of the oscillating arms 30 and 30' with the respective driving levers 33 and 33' are established at the connection points 75 and 75', are provided between the ends of the driving levers 33 and 33'. The pendular oscillating motions of the oscillating arms 30 and 30' are generated in the described manner by the periodic force pulses transmitted from the piezo actuator 2 via the driving levers 33, 33' to the respective oscillating arms 30 and 30' in this embodiment as well.

The arrangement and mode of operation of the exemplary embodiment according to FIG. 15 thus correspond, always relative to one half to the right and left of the plane of symmetry 31, to those according to FIG. 12.

Figure 16:
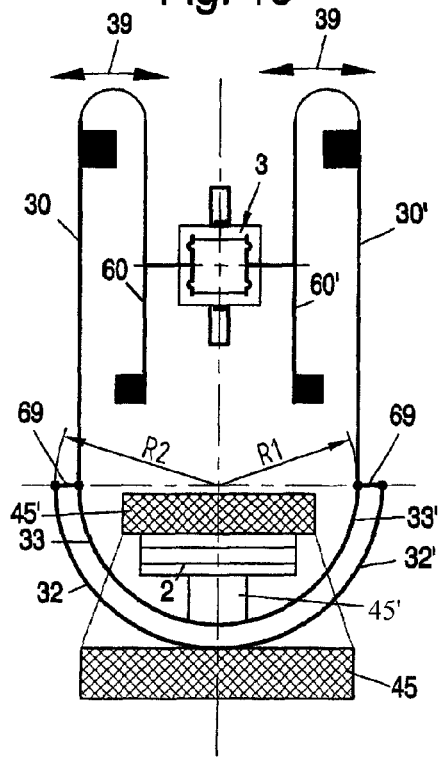
FIG. 16 is a schematic view of another different embodiment of an oscillating drive.

FIG. 16 schematically shows an embodiment in which the components belonging to the oscillating system 1, namely, the oscillating arms 30, 30, balance arms 60, 60', control arms 32, 32' and driving levers 33, 33', are of the same design and are arranged in the same manner as in the embodiment according to FIG. 13. However, the difference from this embodiment according to FIG. 13 is that the piezo actuator 2 does not lie on the foot part of frame 45 but is arranged and fastened within the smaller semicircular arc with the radius R1 at a holding plate 45' and acts on the levers 33, 33' forming the inner semicircular arc. As a result, the function of the control arms 32, 32' is changed to that of driving levers 33 and 33', while the levers forming the larger semicircular arc represent the control arms 32 and 32', which lie on frame part 45 in the area of the plane of symmetry 31. Frame part 45 is rigidly connected to the carrying plate 45' and thus forms the abutment for the control arms 32 and 32'.

It is advantageous in this embodiment to design the two driving levers 33 and 33', i.e., the semicircular arc formed by these two levers, such that its flexural elasticity will be as low as possible and to provide the circular arc formed by the two driving levers 32 and 32' with the greater radius R2 with a flexural elasticity by which the restoring force opposing the driving pulses of the piezo actuator 2, which are directed downwardly in this case, is applied.

FIGS. 17 through 20 schematically show embodiments in which the arc-shaped control arms 32, 32' and driving levers 33, 33', which are arranged on both sides of the plane of symmetry 31 and are connected to one another, form, in pairs each, circle segments of mutually intersecting circles and are connected to one another at the intersections of these circles. The oscillating arms 30 and 30' as well as their balance arms 60 and 60' are of the same design and are arranged in the same manner as in the above-described embodiments.

The two control arms 32 and 32' connected to the oscillating arms 30, 30' at the connection points 75, 75' [grammatical error in German original—Tr.Ed.] together form a semicircular arc 32/1 each with a radius R1 and with the center of curvature M1 in the embodiment according to FIG. 17. The ends of the two control arms 32, 32' are connected to the driving levers 33, 33' at the connection points 80, 80'. The two driving levers 33, 33', which are substantially shorter in this case than the two control arms 32 and 32', together form a circle segment 33/1 with a radius R3, which is smaller than radius R1, and the center M2 thereof is displaced downwardly, i.e., towards the piezo actuator 2, by the measure E2 in the plane of symmetry 31. As in the exemplary embodiments already described, an abutment 35' is associated with the semicircular arc 32/1 formed by the two control arms 32 and 32', and said abutment is connected to the foot part of frame 45 and ensures that the ends of the control arms 32, 32', which are connected to one another in the plane of symmetry 31, have a defined distance from the piezo actuator 2 and that the two driving levers 33 and 33' forming the circular arc 33/1 are elastically in contact with the piezo actuator 2 at their connection point, i.e., in the plane of symmetry 31. The oscillations of the oscillating arms 30 and 30' necessary for the operation of the fluid pump 3 can be generated by the periodic force pulses of the piezo actuator 2 with this embodiment as well.

In the embodiment according to FIG. 18, the two driving levers 33 and 33' together form a semicircle 33/1 with the radius R1 and with the center of curvature M1. The ends of the two driving levers 33 and 33' are connected each to the lower ends of the respective oscillating arms 30 and 30' at the respective connection points 75, 75'. The ends of the driving levers 33 and 33' connected to one another in the area of the plane of symmetry 31 lie together elastically on the piezo actuator 2, which is in turn seated on the foot part of frame 45, in this case as well. In this embodiment, the two control arms 32 and 32' form a circular arc 32/1, which is arched opposite the semicircular arc 33/1 of the two driving levers 33 and 33' with a radius R4, whose center of curvature M4 is located in the area of the foot part of frame 45 in the plane of symmetry 31. An abutment 35, which is rigidly or adjustably connected to the foot part of frame 45, is likewise associated here with the two control arms 32, 32', which must be flexurally elastic in this case, just as the two driving levers 33 and 33'.

The embodiment according to FIG. 19 differs from that according to FIG. 18 only in that the two control arms 32 and 32' form a circular arc 32/1, which has a substantially smaller radius of curvature R5 than the circular arc 32/1 with the radius of curvature R4. The two control arms 32 and 32' are connected each to the driving levers 33, 33' forming a semicircular arc 33/1 at respective connection points 80 and 80'. Both the control arms 32 and 32' and the driving levers 33 and 33', whose ends are in connection with the oscillating arms 30 and 30' at the connection sites 75, 75', must be of a flexurally elastic design here as well. The abutment 35', which is also provided here, is also connected rigidly to the foot part of frame 45 in this case, just as in the other exemplary embodiments as well. As in the exemplary embodiment according to FIG. 18, the force pulses of the piezo actuator 2 are transmitted to the driving lever 33 and 33' forming the semicircular arc 33/1, and these are deflected laterally due to their connection to the respective shorter control arms 32 and 32' and thus bring about the pendular oscillations of the oscillating arms 30 and 30'.

As is shown in FIG. 20, it is also possible in an embodiment according to FIG. 19 to arrange the piezo actuator 2 within the semicircular arc 32/1 or between the two oscillating arms 30 and 30' and to also allow the two levers 33, 33' to act, which form a circle segment 33/1 and are connected to the driving levers 32 and 32' at the respective connection points 80 and 80', so that these lever arms forming the circle segment 32/1 form the driving levers 33 and 33' in this case, while the lever arms forming the semicircle 32/1 represent a respective control arm 32 and 32' each. Similarly to the embodiment according to FIG. 14, the piezo actuator 2 is fastened in this case to a holding plate 45', so that it lies with its underside directly on the driving levers 33 and 33, which are connected to one another in the area of the plane of symmetry 31 and form the circular arc 33/1.

The holding plate 45' is, of course, connected rigidly to the foot part of frame 45 in this case as well. The foot part of frame 45 plays the role of an abutment.

FIG. 21 schematically shows an embodiment that differs from that according to FIG. 17 only in that the two driving levers 33, 33' do not form a circular arc but comprise bent end sections of a bent part 81 lying flat on the piezo actuator 2. The ends of these end sections are connected to the control arms 32, 32', which together form a semicircle 23/1, at connection points 80, 80' located each opposite each other symmetrically to the plane of symmetry in a motion-transmitting manner.

The mode of operation is essentially the same as in the embodiment according to FIG. 17.

The variant according to FIG. 22 forms of a companion piece of the already described embodiment according to FIG. 23 as the piezo actuator 2 arranged within the semicircular arc formed by the two control arms 32, 32' is in motion-transmitting connection with the control arms 32, 32' via straight driving levers 83, 83'. The two driving levers 83, 83' are connected to a control arm 32, 32' each at the connection points 80, 80' arranged symmetrically. Their other ends can be connected to the piezo actuator 2 at a common point or separately via a coupling member 85.

It is possible in all exemplary embodiments shown to utilize the advantageous modes of operation and manufacturing possibilities; in particular, all oscillating systems 1, 1', comprising two oscillating arms 30, 30', two balance arms 60, 60', two control arms 32, 32' or 64, 64' and two driving levers 33, 33' and 63, 63', may be made in one piece of plastic as injection molding parts and inserted into a frame 65 in a such a manner that they are able to function in a simple manner, e.g., without screw connections.

While specific embodiments of the invention have been shown and described in detail to illustrate the application of the principles of the invention, it will be understood that the invention may be embodied otherwise without departing from such principles.

What is claimed is:
1. An electric oscillating drive comprising:
an actuator generating periodic force pulses with a small motion amplitude, the actuator including one of a piezo actuator and an oscillating armature magnet;
an oscillating system, which is driven, in an oscillating manner with an adapted natural frequency, in a preset plane and which has at least one oscillating arm performing oscillating motions with a resonant mass and with a balance arm;
a coupling member of the balance arm;
a working member of a pump working device, the balance arm being in a mechanical driving connection via the coupling member of the balance arm with the working member of the pump working device, which said working member is to be driven in said oscillating manner;
a frame part;
a control arm;
a driving lever, the at least one oscillating arm being fastened to the control arm and to the driving lever, the driving lever and the control arm forming two levers of unequal length, wherein at least the control arm is flexurally elastic at least over some sections and has an end not connected to the at least one oscillating arm that is immovably connected to the frame part, to which the actuator is mounted, at a point located remotely from the at least one oscillating arm, and wherein the driving lever is connected to the actuator in a motion-transmitting manner such that the force pulses of the actuator are sent to the at least one oscillating arm to generate pendular oscillating motions thereof, said pendular oscillating motions being transmitted to the at least one balance arm for driving said working member through the coupling member in the preset plane.

2. An electric oscillating drive comprising:
an actuator including one of a piezo actuator and an oscillating armature magnet, which generates periodic force pulses with a small motion amplitude;
an oscillating system driven, in an oscillating manner with an adapted natural frequency, in a preset plane and which has two oscillating arms, each with a resonant mass and with a balance arm;
two coupling members;
two working members of a working device, the oscillating system performing oscillating motions and being in a mechanical driving connection via the coupling members with the working members, which said working members are to be driven in said oscillating manner;
a frame part;
control arms;
driving levers, the two oscillating arms being fastened each to one of the control arms and one of the driving levers, the control arms and the driving levers forming a pair of two levers of unequal length, the two oscillating arms being provided in a symmetrical arrangement in relation to a plane of symmetry, wherein the control arms are each flexurally elastic at least in some sections and an end not connected to said oscillating arms is immovably connected at a point located remotely from the oscillating arm to the frame part, in which the actuator is mounted, and wherein the driving levers are in connection with the actuator in a motion-transmitting manner such that the force pulses of the actuator are sent to the oscillating arms to generate pendular oscillating motions thereof, said pendular oscillating motions being transmitted to the balance arms for driving said working members through the coupling members in the preset plane.

3. The electric oscillating drive in accordance with claim 2, wherein the plane of symmetry extends vertically.

4. The electric oscillating drive in accordance with claim 2, wherein the balance arms are connected to the oscillating arms and wherein:
the oscillating arms, the balance arms as well as the control arms and driving levers are formed of a dimensionally stable plastic; and
the balance arms, the control arms and the driving levers associated with the oscillating arms each are connected to the oscillating arms in one piece via flexurally elastic connecting members.

5. The electric oscillating drive in accordance with claim 4, wherein the balance arms are formed of a dimensionally stable, flexurally elastic plastic and the oscillating motions of each of the two oscillating arms are located symmetrically opposite each other on both sides of the plane of symmetry and the associated balance arms extend synchronously and in opposite directions to one another.

6. The electric oscillating drive in accordance with claim 5, wherein the connections between the oscillating arms and control arms as well as the driving levers are arranged in a mirror-inverted manner in relation to one another on both sides of the plane of symmetry.

7. The electric oscillating drive in accordance with claim 4, wherein each balance arm is of the same length as the oscillating arm and oscillates synchronously therewith.

8. The electric oscillating drive in accordance with claim 2, wherein one or more of the oscillating arms and balance arms assume a parallel position in relation to the common plane of symmetry in the inoperative position.

9. The electric oscillating drive in accordance with claim 2, wherein the control arms are each mounted outside a plane in which the respective connected oscillating arms extend at a defined distance from the actuator.

10. The electric oscillating drive in accordance with claim 9, wherein the control arms and driving levers arranged on both sides of the plane of symmetry complement each other in pairs to form a semicircle.

11. The electric oscillating drive in accordance with claim 10, wherein the semicircles formed by the control arms and the driving levers have different radii each with identical centers.

12. The electric oscillating drive in accordance with claim 10, wherein the semicircles formed by the control arms and the driving levers have each equal radii with centers offset in relation to one another in the plane of symmetry.

13. The electric oscillating drive in accordance with claim 2, wherein one or more of the control arms and driving levers are of an arc-shaped design in a symmetrical arrangement to the plane of symmetry and are connected to one another in pairs in the area of the plane of symmetry.

14. The electric oscillating drive in accordance with claim 13, wherein the arc-shaped control arms and driving levers are arranged on both sides of the plane of symmetry and are connected to one another in the plane of symmetry to form pairs of circular segments of mutually intersecting circles and are connected to one another at the intersections of these circles.

15. The electric oscillating drive in accordance with claim 2, wherein the driving levers are connected to one another in an area of the plane of symmetry in a flexurally elastic or articulated manner.

16. The electric oscillating drive in accordance with claim 2, wherein the two driving levers are each connected separately to the actuator via a further coupling member.

17. The electric oscillating drive in accordance with claim 2, wherein the balance arms are located directly opposite each other on both sides of the plane of symmetry and are each in functional connection with the working members being pump diaphragms of a common pump chamber of the working device comprising a fluid pump arranged between the two balance arms.

18. The electric oscillating drive in accordance with claim 2, further comprising an elastic driving connection between the balance arms and the working members.

19. The electric oscillating drive in accordance with claim 2, wherein:
the control arms and driving levers are arc-shaped; and
the actuator is arranged outside the arc-shaped control arms and driving levers.

20. The electric oscillating drive in accordance with claim 2, wherein:
the control arms and driving levers are arc-shaped; and
the actuator is arranged within the arc-shaped control arms and driving levers.

21. The electric oscillating drive in accordance with claim 2, further comprising an abutment under the action of a spring force wherein the control arms are in contact with the abutment, said abutment having a defined distance from the actuator.

22. The electric oscillating drive in accordance with claim 2, wherein the driving levers comprise two driving levers arranged together outside the control arms and are provided with a foot part, which is symmetrical to the plane of symmetry and which is elastically connected with the actuator.

23. The electric oscillating drive in accordance with claim 22, wherein said actuator comprises a first and a second actuator, wherein each driving lever is functionally connected separately with one of said first and said second actuators of the actuator, which are arranged separated from each other but are supplied by a common power source.

24. The electric oscillating drive in accordance with claim 23, further comprising a support part which is symmetrical to the plane of symmetry, acting as an abutment to the driving levers, immovably connected to the frame part and acting as a fixed bearing for the actuator.

25. The electric oscillating drive in accordance with claim 24, wherein the frame part is provided with two wall elements, which receive between them the foot part of the two driving levers and the actuator and to which the support part is fastened.

26. The electric oscillating drive in accordance with claim 23, wherein the working members are pump diaphragms of a common pump chamber of the working device comprising a fluid pump arranged between the two balance arms the fluid pump being fastened at or on the support part.

27. The electric oscillating drive in accordance with claim 2, wherein the driving levers comprise two driving levers and the control arms comprise two control arms wherein the two control arms the two driving levers together form a contiguous arc bent against a foot part, whose ends are connected in one piece to a respective one of the oscillating arms and whose middle section lies on the actuator in a motion-transmitting manner.

28. The electric oscillating drive in accordance with claim 27, wherein the two control arms are connected in one piece to the oscillating arms and each are made integrally in one piece with mutually opposite sides of the foot part and are each connected to the oscillating arms outside the driving levers.

29. The electric oscillating drive in accordance with claim 28, wherein a base part is fastened to the foot part, and said base part has a carrier arm for a fluid pump at a lateral wall element on the concave side of the arc formed by the two driving levers.

30. The electric oscillating drive in accordance with claim 27, wherein the actuator is arranged between the contiguous arc formed by the two driving levers and the foot part.

* * * * *